(12) United States Patent
Tominaga et al.

(10) Patent No.: US 8,530,314 B2
(45) Date of Patent: Sep. 10, 2013

(54) SOLID-STATE MEMORY MANUFACTURING METHOD

(75) Inventors: Junji Tominaga, Tsukuba (JP);
Takayuki Shima, Tsukuba (JP);
Alexander Kolobov, Tsukuba (JP); Paul Fons, Tsukuba (JP); Robert Simpson, Tsukuba (JP); Reiko Kondo, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 51 days.

(21) Appl. No.: 12/998,482

(22) PCT Filed: Sep. 28, 2009

(86) PCT No.: PCT/JP2009/004938
§ 371 (c)(1),
(2), (4) Date: Apr. 26, 2011

(87) PCT Pub. No.: WO2010/050118
PCT Pub. Date: May 6, 2010

(65) Prior Publication Data
US 2011/0207284 A1    Aug. 25, 2011

(30) Foreign Application Priority Data

Oct. 30, 2008 (JP) ................................. 2008-280134

(51) Int. Cl.
*H01L 21/336* (2006.01)
(52) U.S. Cl.
USPC ....................................................... 438/287
(58) Field of Classification Search
None
See application file for complete search history.

(56) References Cited

U.S. PATENT DOCUMENTS

| | | | | |
|---|---|---|---|---|
| 4,773,059 | A | * | 9/1988 | Minemura et al. ............ 369/100 |
| 6,809,401 | B2 | | 10/2004 | Nishihara et al. |

(Continued)

FOREIGN PATENT DOCUMENTS

| | | |
|---|---|---|
| JP | 2002-203392 | 7/2002 |
| JP | 2008235863 A | 10/2008 |
| WO | WO-2008001411 A1 | 1/2008 |
| WO | WO-2008068807 A1 | 6/2008 |

OTHER PUBLICATIONS

Masahiro Okuda, "Technology and Materials for Future Optical Memories," CMC Publishing Co., Ltd., Jan. 31, 2004, pp. 114-115 (partial English translation).

(Continued)

*Primary Examiner* — Charles Garber
*Assistant Examiner* — Andre' C Stevenson
(74) *Attorney, Agent, or Firm* — Harness, Dickey & Pierce, P.L.C.

(57) ABSTRACT

A method of at least one embodiment of the present invention of manufacturing a solid-state memory is a method of manufacturing a solid-state memory, the solid-state memory including a recording film whose electric characteristics are varied by phase transformation, the method including: forming the recording film by forming a laminate of two or more layers so that a superlattice structure is provided, each of the layers having a parent phase which shows solid-to-solid phase-transformation, the recording film being formed at a temperature not lower than a temperature highest among crystallization temperatures of the parent phases. It is thus possible to manufacture a solid-state memory which requires lower current for recording and erasing data and has a greater rewriting cycle number.

4 Claims, 3 Drawing Sheets

(56) References Cited

U.S. PATENT DOCUMENTS

2002/0131309 A1 9/2002 Nishihara et al.
2008/0001136 A1* 1/2008 Chong et al. .................... 257/4
2008/0149909 A1 6/2008 Philipp et al.

OTHER PUBLICATIONS

Yoshito Tsunoda, "Basis and Application of Optical Disc Storage (Hikari Disc Storage no Kiso to Oyo)," The Institute of Electronics, Information and Communication Engineers, $1^{st}$ edition, Jun. 1, 2001, $3^{rd}$ issue, p. 209 (partial English translation).

N. Yamada & T. Matsunaga, "Structure of laser-crystallized $Ge_2Sb_2 + {}_xTe_5$ sputtered thin films for use in optical memory," Journal of Applied Physics, 88, 2000, pp. 7020-7028, Dec. 2000.

A. Kolobov et al., "Understanding the phase-change mechanism of rewritable optical media," Nature Materials 3, 2004, pp. 703-708, Sep. 12, 2004.

Masahiro Okuda, "Technology and Materials for Future Optical Memories," CMC Publishing Co., Ltd., Jan. 31, 2004, pp. 14-17 (Full English translation).

International Search Report (Form PCT/ISA/210).

* cited by examiner

○ : Te     ● : Sb     ▲ : Ge

○ : Te     ● : Sb     ▲ : Ge

SOLID-STATE MEMORY MANUFACTURING METHOD

TECHNICAL FIELD

The present invention relates to a solid-state memory in which, by use of phase transformation, data is recorded and erased as a difference in electric resistivity between a crystal state and an amorphous state. Particularly, the present invention relates to a phase change RAM (Random Access Memory) (hereinafter, PCRAM (Phase-change Random Access Memory)).

BACKGROUND ART

PCRAMs have been studied in order to accomplish an ultrahigh-density memory. PCRAMs carry out recording and erasing of data by utilizing a physical property change caused by a transition (called $1^{st}$-order phase-transition) between a crystalline state and an amorphous state of chalcogenides containing Te (for example, see Patent Literature 1 and Non Patent Literatures 1 and 2).

Usually, a recording material in PCRAM is a single-layer alloy thin film formed between electrodes by a vacuum film forming method such as sputtering or the like using a chemical composition. Because the alloy thin film is formed in such a manner, the alloy thin film has a thickness in a range of 20 nm to 50 nm, and is polycrystalline but not monocrystalline.

Since the latter half of the 1980s, chalcogenides containing Te have been studied as to its crystal structures and amorphous structures by structure analysis using X-rays or the like. The crystal structures of the chalcogenides had not been understood in details until 2004 due to the presence of Sb atoms in the chalcogenides containing Te, because X-ray diffraction or electron diffraction can hardly distinguish Te from Sb, which is next to Te and has only one less electron than Te.

This led to misunderstanding as to crystal structures of GeSbTe (225) and compounds similar to pseudo-binary composition compounds (such as 225, 147, 125 similar to GeTe—$Sb_2Te_3$), which are experimentally known to have very excellent properties and used in rewritable optical discs already on the market. It had been believed that the crystal structures of these compounds are sodium-chloride structures in which Te occupies Na sites (referred to as site a) and Ge or Sb occupies Cl sites (referred to as site b) randomly (for example, see Non Patent Literature 3).

However, the use of a synchrotron radiation X-ray analysis made it possible to perform a detailed structure analysis of the GeSbTe compound, thereby revealing that the chalcogenides including Te has a structure differed from that had been believed by then in terms of the points described below (for example, see Non Patent Literature 4).

Namely, the following points were found: (1) the crystal phase of the chalcogenides including Te is such that the Ge atoms and Sb atoms occupy the positions of Cl (site (b)) in a NaCl type simple cubic lattice not "randomly" as considered conventionally but that the positions of the Ge atoms and Sb atoms in the configuration are accurately "fixed", and that the lattice is distorted (see FIG. 2); (2) the amorphous state of the chalcogenides including Te is not completely random and takes a twisted structure with a unit configuration in which the Ge atom inside the crystal lattice is shifted by 0.2 Å toward the Te atom from a center position (is slightly off the center thereby being ferroelectric) (see FIG. 3); and (3) stably repeatable high-speed switching is attained by utilizing restoration of this twisted unit (see FIG. 4).

Note that in FIG. 4, the structure illustrated on the left side corresponds to the structure illustrated in FIG. 2, and the structure illustrated on the right side corresponds to the structure illustrated in FIG. 3.

CITATION LIST

Patent Literature

Patent Literature 1
Japanese Patent Application Publication, Tokukai, No. 2002-203392 A (Jul. 19, 2002)

Non Patent Literature

Non Patent Literature 1
Masahiro Okuda et al., "Technology and Materials for Next-Generation Optical Memories", CMC Publishing, CO., LTD., published Jan. 31, 2004; p 114
Non Patent Literature 2
Yoshito Tsunoda et al., "Basics and Applications of Optical Disk Storage", The Institute of Electronics, Information and Communication Engineers, 1st Edition published Jun. 1, 2001, 3rd issue; p 209
Non Patent Literature 3
N. Yamada & T. Matsunaga, Journal of Applied Physics, 88, (2000); p 7020-7028
Non Patent Literature 4
A. Kolobov et al., Nature Materials 3 (2004); p 703

SUMMARY OF INVENTION

Technical Problem

However, there is a demand for a solid-state memory which requires a lower current for recording and erasing data and which allows for an increase in a cycle number for recording and erasing data (hereinafter, may be referred to as rewriting cycle number).

It is considered that the rewriting cycle number is limited in the conventional structure mainly because thermal material flow of the recording film is caused at a high temperature and consequently deforms the film by the whole (for example, see Non Patent Literature 2).

The present invention is accomplished in view of the foregoing problem, and an object thereof is to achieve a method of manufacturing a solid-state memory, which requires a lower current in recording and erasing data while allowing for an increase in the cycle number for recording and erasing data.

Solution to Problem

The inventors of the present invention carried out diligent studies to attain the object. More specifically, the inventors of the present invention considered as follows:

Recording and erasure of data on the PCRAM is carried out based on a physical property change caused by a $1^{st}$-order phase-transition between a crystalline state and an amorphous state of a Te-containing chalcogenide as the recording material. Since a recording thin film of the PCRAM is not monocrystalline but is polycrystalline, there is a variation of electrical resistivity of the recording film. Further, a volume change at the phase transition is large. As a result, the current required for recording or erasing data is increased. Moreover, the cycle number for recording and erasing is limited.

Based on this consideration, the inventors of the present invention found out that it is possible to attain a dramatic reduction in interfacial electric resistivity between crystallites and a significant increase in the rewriting cycle number by forming in a recording film of the PCRAM a superlattice structure of a chalcogenide containing Ge and Te by forming a laminate of a plurality of layers, which recording film employs a writing and reading principle similar to a Te alloy containing Ge. The present invention is based on this finding.

Namely, in order to attain the object, a method according to the present invention of manufacturing a solid-state memory is a method of manufacturing a solid-state memory, the solid-state memory including a recording film whose electric characteristics are varied by phase transformation, the method including: forming the recording film by forming a laminate of two or more layers so that a superlattice structure is provided, each of the layers having a parent phase which shows solid-to-solid phase-transformation, the recording film being formed at a temperature not lower than a temperature highest among crystallization temperatures of the parent phases.

According to the method, a superlattice structure is formed in the recording film by forming a laminate of two or more layers. Each of the layers has a parent phase, which shows the solid-to-solid phase transformation. With this, a dynamic direction of atoms in the recording film during data recording or data erasing can be controlled.

As a result, a large amount of input energy is used for movement of the atoms, thereby reducing energy release in the form of heat. This as a result improves energy efficiency for carrying out the phase transformation.

Moreover, this also can reduce the volume change of the recording film in rewriting; hence, it is possible to achieve a stable rewriting operation without compositional segregation.

Hence, with the method, it is possible to manufacture a solid-state memory which requires a lower current in recording and erasing data and which has a greater rewriting cycle number.

In the method according to the present invention of manufacturing the solid-state memory, it is preferable that the recording film include Ge, Sb, or Te as its main component.

According to the method, it is possible to manufacture a solid-state memory which requires a lower current in recording and erasing data and which has a greater rewriting cycle number.

In the method according to the present invention of manufacturing the solid-state memory, it is preferable that the temperature at which the recording film is formed is not more than a temperature lowest among melting points of the parent phases or is not more than a melting point of a compound having a composition including the superlattice structure.

According to the method, it is possible to manufacture a solid-state memory which requires a lower current in recording and erasing data and which has a greater rewriting cycle number.

Advantageous Effects of Invention

As described above, the method according to the present invention of manufacturing the solid-state memory solid state includes forming the recording film by forming a laminate of two or more layers so that a superlattice structure is provided, each of the layers having a parent phase which shows solid-to-solid phase-transformation, the recording film being formed at a temperature not lower than a temperature highest among crystallization temperatures of the parent phases.

Hence, it is possible to manufacture a solid-state memory which requires a lower current in recording and erasing data and which has a greater rewriting cycle number.

DESCRIPTION OF EMBODIMENTS

Figure 1:
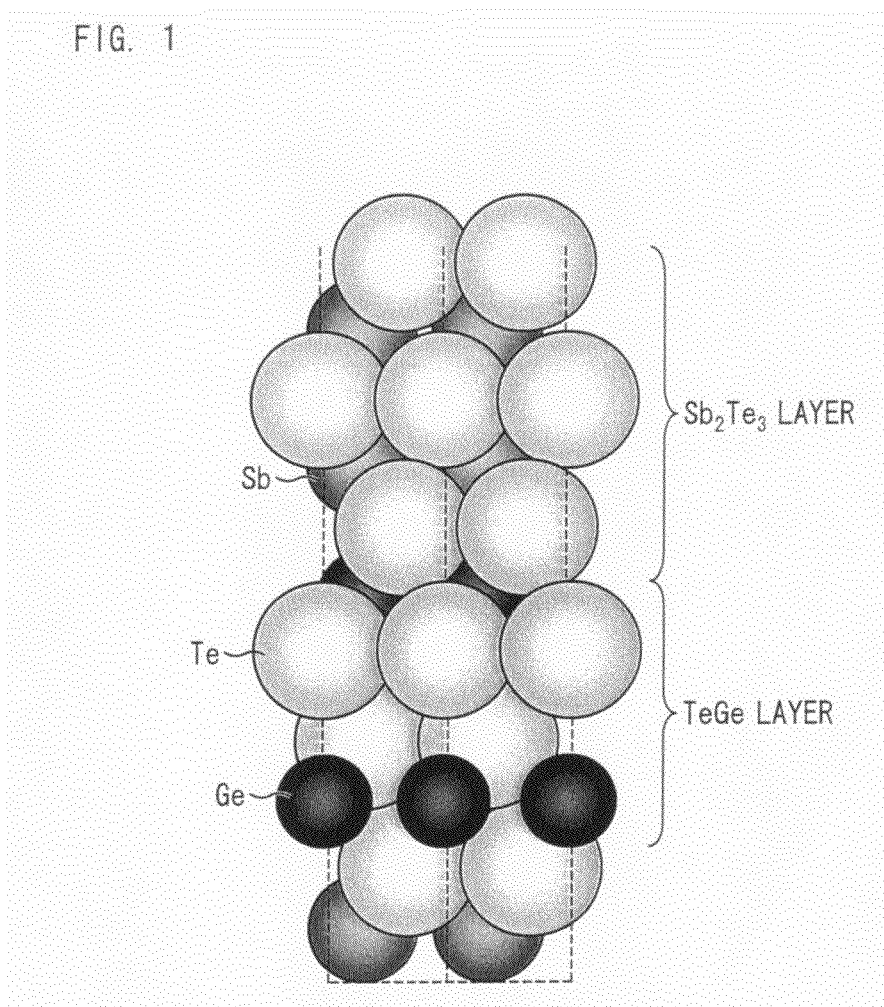
FIG. 1 is a cross sectional view schematically illustrating an example of a structure of a recording film in a solid-state memory obtained by a method according to the present embodiment.

One embodiment of the present invention is described as below.

The wording "main component" denotes a component that accounts for a largest portion of a composition of something. Namely, "a recording film whose main component is Ge, Sb, or Te" denotes that a content of any one of Ge, Sb, and Te is of the greatest content in the recording film.

A method according to the present embodiment of manufacturing a solid-state memory includes forming the recording film by forming a laminate of two or more layers so that a superlattice structure is provided, each of the layers having a parent phase which is phase-transformable between solid states.

Herein, the wording "superlattice" denotes a crystal lattice having a periodic structure longer than that of a basic unit lattice. The superlattice is produced by superposing a plurality of types of crystal lattices. The wording "superlattice structure" denotes a structure having such a crystal lattice.

The wording "parent phase which shows solid-to-solid phase transformation" denotes a parent phase, which is phase-transformable from a solid state to a solid state without going through a non-solid state. Examples of such a parent phase include a parent phase which is phase-transformable directly between a crystalline state and a non-crystalline state. Moreover, a layer having the parent phase which shows solid-to-solid phase transformation is preferably a layer made of just a phase which shows solid-to-solid phase transformation.

Note that the wording "parent phase" of a layer denotes a phase existing in a largest portion (volume) of the layer from among phases constituting the layer.

It is preferable that the recording film include Ge, Sb, or Te as its main component. Moreover, the recording film may include Ge, Sb and Te as its main component, the recording film may include Ge, Bi, and Te as its main component, the recording film may include Al, Sb, and Te as its main component, and the recording film may include Al, Bi, and Te as its main component.

Examples of combinations of elements that make up the main component of the recording film may include a combination of Ge and Sb and Te, a combination of Ge and Bi and Te, a combination of Al and Sb and Te, a combination of Al and Bi and Te, and the like combinations. From among these combinations, the combination of Ge and Sb and Te is preferable.

Examples of constituents of the layer made up of the parent phase which shows solid-to-solid phase transformation are: GeTe, $Sb_2Te_3$ and the like in a case where the main component of the recording film is Ge, Sb, and Te; GeTe, $Bi_2Te_3$, Bi and the like in a case where the main component of the recording film is Ge, Bi, and Te; AlTe, $Sb_2Te_3$, and the like in a case where the main component of the recording film is Al, Sb, and Te; and AlTe, $Bi_2Te_3$, Bi, and the like in a case where the main component of the recording film is Al, Bi, and Te.

The following description explains the case where the main component of the recording film is Ge, Sb, and Te.

In forming the recording film, it is preferable that the GeTe layer and the $Sb_2Te_3$ layer be stacked so that the two layers are adjacent to each other. This allows for forming a superlattice structure made up of the GeTe layer and the $Sb_2Te_3$ layer.

It is considered that, in the superlattice structure made by a lamination of the GeTe layer and the $Sb_2Te_3$ layer, Ge atoms present inside the GeTe layer can be dispersed on an interface of the GeTe layer and the $Sb_2Te_3$ layer due to electric energy inputted into a memory, whereby a structure similar to a crystalline state can be formed as a "anisotropic crystalline structure" (erasure state (or recording state)).

Moreover, the superlattice structure is considered to be such that the Ge atoms accumulated on the interface is returned back to the GeTe layer by the electric energy inputted into the memory. As a result, the superlattice structure returns from "anisotropic crystalline structure" to an "amorphous-like structure" (recording state (or erasure state). The amorphous-like structure is a structure having an electric resistivity equivalent to that of a random structure having been called the "amorphous".

In the embodiment, the manufacturing method according to the present embodiment forms the superlattice structure. Hence, the dynamic direction of the Ge atoms can be unchanged between the two states. As a result, more of the input energy can be converted to work, and the amount of energy released as heat is reduced. As a result, energy efficiency for the phase transformation improves, thereby allowing remarkable improvement in the properties of the PCRAM.

The $Sb_2Te_3$ layer may be a laminate having just one set of a structure unit of (Te—Sb—Te—Sb—Te), or may be a laminate having a plurality sets of the structure unit, as like (Te—Sb—Te—Sb—Te)$_n$ (note: n is any integer).

Similarly, the GeTe layer may be a layer formed by stacking just one set of a structure unit of Te—Ge or Ge—Te, or may be a layer formed by stacking a plurality of sets of the structure unit, as like (Te—Ge)$_n$ or (Ge—Te)$_n$ (note: n is any integer).

In the method according to the present embodiment of manufacturing a solid-state memory, the layer having the parent phase which shows solid-to-solid phase transformation is not particularly limited in its thickness, however is preferably in a range of not less than 0.1 nm to not more than 2 nm in thickness. Layer thicknesses of the layers described in the present specification can be measured by cross-sectional observation using a transmission electron microscope.

Figure 2:
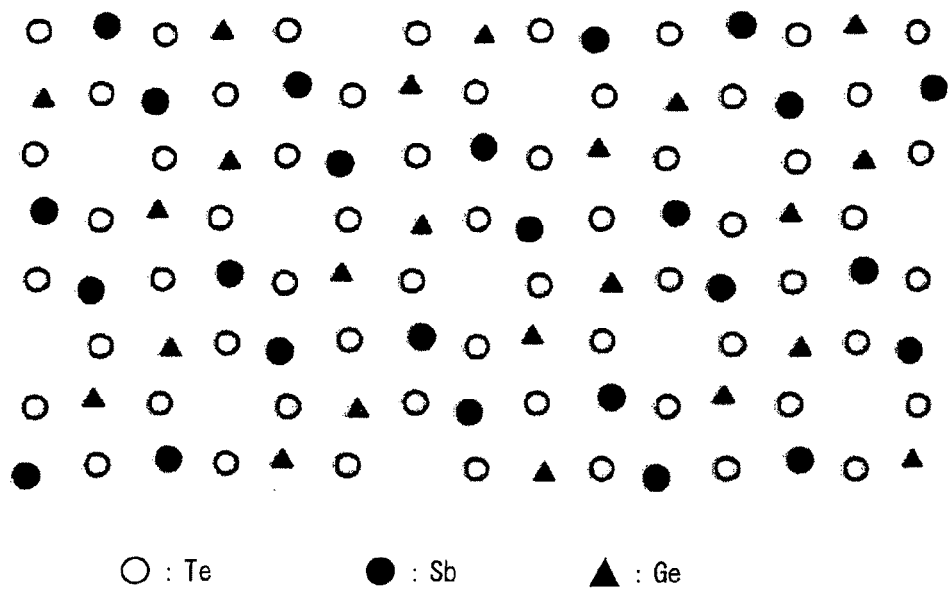
FIG. 2 is a plan view schematically illustrating an example of a crystal structure of a Ge—Sb—Te alloy in a conventional solid-state memory.
Figure 3:
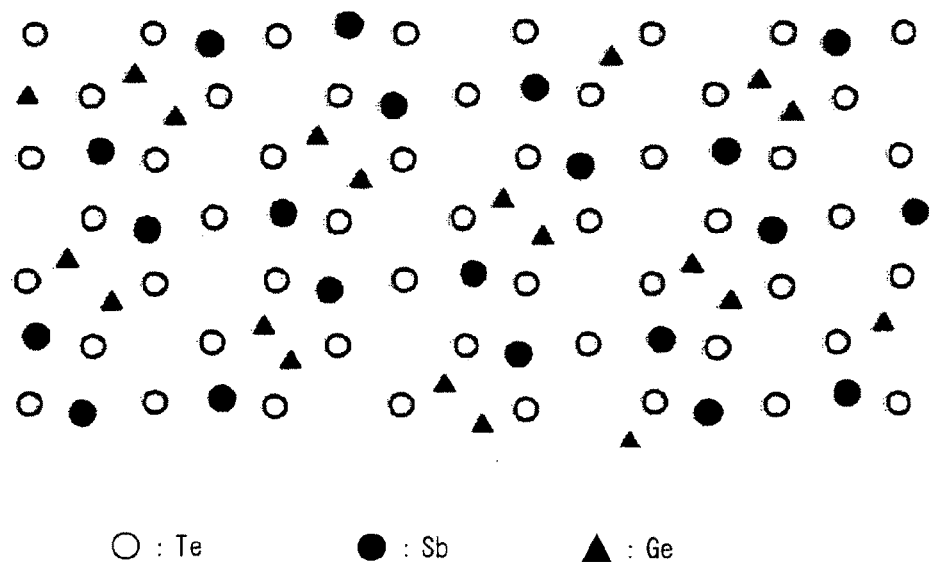
FIG. 3 is a plan view schematically illustrating an example of an amorphous structure of a Ge—Sb—Te alloy in a conventional solid-state memory.
Figure 4:
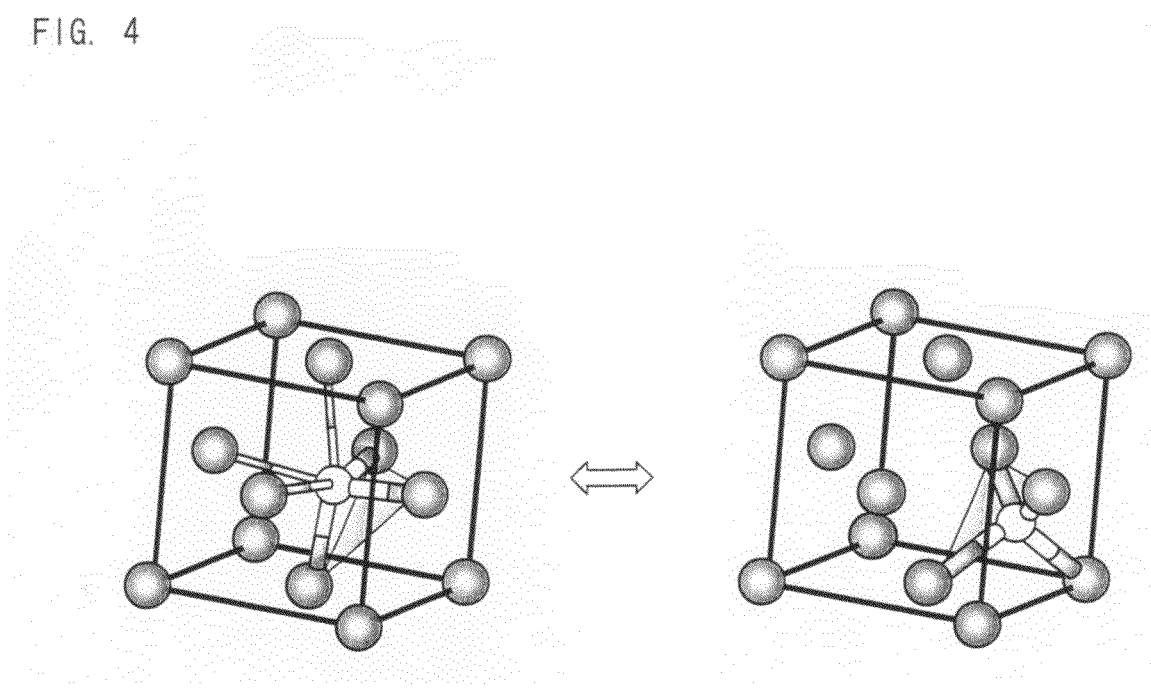
FIG. 4 is a perspective view schematically illustrating high-speed switching in a Ge—Sb—Te alloy in a conventional solid-state memory.

FIG. 1 illustrates one example of a structure of a recording film in the solid-state memory obtained by the method according to the present embodiment. The configuration illustrated in FIG. 1 includes, in order from the bottom, the GeTe layer (—Ge—Te—Te—Ge—) and the $Sb_2Te_3$ layer (—Te—Sb—Te—Sb—Te—). This configuration is not of a cubic crystal as illustrated in FIG. 2 and FIG. 3 but is of a hexagonal crystal whose axis c is along the vertical direction of FIG. 1. In this exemplary embodiment, the thickness of the GeTe layer is approximately 0.79 nm, and the thickness of the $Sb_2Te_3$ layer is approximately 0.98 nm.

In the superlattice structure illustrated in FIG. 1, the dynamic direction of the Ge atoms is in one direction (namely, is coherent). As a result, a greater amount of the input energy can be converted to work, thereby reducing the amount of energy released as heat. That is to say, the energy efficiency for carrying out the phase transformation improves.

In a case where a single-layered recording film is produced by use of a compound target made of a certain composition of GeSbTe, the recording film thus produced includes various types of crystallites. Hence, the dynamic direction of the Ge atoms in the recording film is random according to the crystallites, and electric energy used for moving the Ge atoms is not coherent. Hence, a greater amount of heat energy is released to the system thermodynamically.

The superlattice structure illustrated in FIG. 1 is configured such that the phase transformation to the amorphous-like structure is utilized, whereby the volume change at the data rewriting is reduced to not more than 3% structure, meanwhile the volume change is conventionally not less than 5%. Moreover, in the superlattice structure illustrated in FIG. 1, the volume change is a uniaxial volume change. As a result, composition segregation is difficult to occur, thereby making it possible to provide a stable rewriting operation.

In the method according to the present embodiment of manufacturing the solid-state memory, the lamination of the layer may be carried out by conventionally known methods, such as sputtering or a vapor phase growth method.

For instance, in a case where the lamination is formed by sputtering, a layer forming time may be predetermined by measuring a layer forming rate per unit of time with respect to charging electricity power for the sputtering that is carried out with use of compound targets made up of GeTe and $Sb_2Te_3$ (or with use of the element targets individually). In this way, the superlattice structure can be easily provided simply by managing the layer forming time.

In the method according to the present embodiment of manufacturing a solid-state memory, it is preferable that the forming of the recording film be carried out at a temperature equal to or higher than a crystallization temperature highest among those of the layers. Namely, before producing the superlattice structure, it is preferable to have the layers in a crystal state in advance by maintaining all the formed layers at a temperature not less than their unique crystallization temperatures of the parent phases of the layers.

This prevents each layer from being in an insufficient crystal state locally. Such an insufficient crystal state occurring locally causes unstable balance in the interfacial tension between the parent phases or misalignment of the dynamic directions of Ge atom movement. By preventing the failure of achieving the crystal state uniformly, it becomes possible to attain an increase in the rewriting cycle number, and to carry out the rewriting operation with lower electricity.

For example, in the structure illustrated in FIG. 1, the crystallization temperature of $Sb_2Te_3$ is approximately 100° C., and the crystallization temperature of GeTe is 230° C. at the highest. Hence, in order to produce the superlattice, it is preferable that the substrate is heated by at least a temperature higher than 230° C. By maintaining the temperature of all formed layers at a temperature higher than 230° C. as such, it becomes possible to form a film in which the dynamic directions of the Ge atoms at rewriting are substantially aligned with a thickness direction with respect to the substrate.

Particularly, it is preferable that a temperature at a time of producing the superlattice structure is in a range of not less than a temperature highest among the crystallization temperatures of the parent phases to not more than a melting point lowest among melting points of the parent phases, or that the temperature at a time of producing the superlattice structure is in a range of not less than the temperature highest among the crystallization temperatures of the parent phases to not more than a melting point of a compound having a composition which constitutes a superlattice structure artificially. This allows for attaining a greater rewriting cycle number, and allows for carrying out the rewriting operation with further lower electricity.

The "crystallization temperature" denotes a temperature at which phase transition is caused from a non-crystalline state to a crystalline state, and specifically it is measured by a differential thermal analysis apparatus.

Moreover, the "melting points of the parent phases" can be determined by use of a differential thermal analysis apparatus, and the "melting point of the compound having the composition which constitutes the superlattice structure" can be determined by use of the differential thermal analysis apparatus.

The present embodiment mainly describes the recording film of the solid-state memory; arrangements similar to conventional techniques (for example, Patent Literature 1 and the like) are employable for other configurations required in a solid-state memory other than the recording film, such as an electrode and an arrangement for reading and writing data in a memory. Moreover, these other arrangements of the solid-state memory may be manufactured by a method as similar to a conventional technique.

For instance, a solid-state memory having a lamination of a substrate, a lower electrode, a recording film, and an upper electrode may be manufactured by: (i) forming the lower electrode on the substrate by sputtering or the like, thereafter (ii) forming the recording film thereon, and subsequently (iii) forming the upper electrode thereon by sputtering or the like. Electric energy is supplied to the recording film via each of the electrodes in the solid-state memory, thereby allowing writing in and reading out of data.

Examples of material making up the electrodes (upper electrode, lower electrode) encompass TiN, W, and like material. Moreover, an example of material that constitutes the substrate is Si.

The foregoing description explains a case where the recording film of the solid-state memory includes Ge and Sb and Te as its main component. Similar effects are attained in cases where: the recording film of the solid-state memory includes Ge and Bi and Te as its main component; in cases where the recording film includes Al and Sb and Te as its main component; and in cases where the recording film includes Al and Bi and Te as its main component.

That is to say, in a case where Ge, Bi and Te serve as the main component, a substantially same effect is attained with Bi replacing Sb; in a case where Al, Sb, and Te serve as the main component, a substantially same effect is attained with Al replacing Ge; and in a case where Al, Bi, and Te serve as its main component, a substantially similar effect is attained with Bi replacing Sb and with Al replacing Ge.

EXAMPLES

Described below is a more specific description of the present invention based on Examples. Note that the present invention is not limited to the following Examples.

Example 1

A PCRAM was produced based on a basic structure of a general self-resistivity heating type.

More specifically, a superlattice described below was formed, between electrodes of TiN, on a Si substrate patterned by using photoresist in advance. The film formation was carried out at a substrate temperature of 240° C. and a helicon wave type RF sputtering device on which targets made of respective pure metals (purity: 99.99%) of Ge, Sb, and Te and each had a diameter of 2 inches were disposed.

The PCRAM was produced under production conditions as follows: The film formation was carried out with use of Ar gas and with a pressure of 0.47 Pa; An electric power of 12.5 W was applied for the Te target, an electric power of 12.8 W was applied for the Sb target, and an electric power of 45 W was applied for the Ge target. To a plasma stabilization coil disposed right above the targets, an electric power of 20 W was applied. A distance between the substrate on which the superlattice was to be formed and the targets was 200 mm.

Under these conditions, the recording film was formed with a lamination of ten layers of a superlattice. The electrodes were made of TiN. Each layer of the superlattice was made up of [—Te—Sb—Te—Sb—Te—/—Ge—Te—Te—Ge—/—Te—Sb—Te—Sb—Te—]. The recording film made up of the superlattice had a thickness on the whole of 35 nm. The size of the cells was 100 nm×100 nm.

The GeTe layer had a crystallization temperature of not more than 230° C., a melting point of 723° C., and a layer thickness of 0.80 nm. Moreover, the $Sb_2Te_3$ layer had a crystallization temperature of approximately 100° C., a melting point of 617° C., and a layer thickness of 0.98 nm.

Under programmed voltage application on the PCRAM thus prepared, currents required for recording and erasing data in the device were measured. It was found that the current for resetting (crystallization) was 0.02 mA, and the erasure was possible in 10 ns. The rewriting cycle number at these current values was measured to find that the rewriting cycle number was $10^{17}$ cycles. Moreover, a resistivity at the time of the recording differed by 500 fold from that at the time of the erasure.

Comparative Example 1

A PCRAM was produced based on a basic structure of a general self-resistivity heating type, as in Example 1, except that a substrate temperature at the time of film formation was 150° C., and a single-layered film of $Ge_2Sb_7Te_8$ having a thickness of 25 nm was formed as the recording film. The size of the cell was 100 nm×100 nm.

Under programmed voltage application on the PCRAM thus prepared, currents required for recording and erasing data in the device were measured. It was found that the current for resetting (crystallization) was 0.1 mA, and the erasure was only possible in 30 ns. The rewriting cycle number at these currents was measured to find that the rewriting cycle number was $10^{15}$ cycles. Moreover, a resistivity at the time of the recording differed by 800 fold from that at the time of the erasure.

As described above, the solid-state memory obtained by the manufacturing method according to the present embodiment is capable of reducing interfacial electric resistivity between crystallites as much as possible and reducing a current for data recording to not more than one fifth of that of a conventional PCRAM, and further can improve the rewriting cycle number by two digits or more as compared to the conventional PCRAM.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The method of manufacturing a solid-state memory in accordance with the present invention allows for manufacturing of a solid-state memory, which requires a lower current for recording and erasing data and is increased in the rewriting cycle number. Hence, this method is suitably applicable to manufacturing methods of various solid-state memories.

The invention claimed is:

1. A method of manufacturing a solid-state memory, the solid-state memory including a recording film whose electric characteristics are varied by phase transformation, the method comprising:
    forming the recording film by forming a laminate of two or more layers to provide a superlattice structure,
    wherein each of the two or more layers has a parent phase which shows solid-to-solid phase-transformation, and
    wherein each of the two or more layers is formed at a temperature not lower than a highest crystallization temperature of the parent phases of the two or more layers.

2. The method according to claim 1, wherein the recording film comprises Ge, Sb, or Te as its main component.

3. The method according to claim 1, wherein the temperature at which each of the two or more layers is formed is not more than: (i) a lowest melting point temperature of the parent phases of the two or more layers; or (ii) a melting point temperature of a compound comprising the superlattice structure.

4. The method according to claim 2, wherein the temperature at which each of the two or more layers is formed is not more than: (i) a lowest melting point temperature of the parent phases of the two or more layers; or (ii) a melting point temperature of a compound comprising the superlattice structure.

* * * * *